United States Patent
Van Dalen

(10) Patent No.: US 6,445,019 B2
(45) Date of Patent: Sep. 3, 2002

(54) LATERAL SEMICONDUCTOR DEVICE FOR WITHSTANDING HIGH REVERSE BIASING VOLTAGES

(75) Inventor: Rob Van Dalen, Eindhoven (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/815,619

(22) Filed: Mar. 23, 2001

(30) Foreign Application Priority Data

Mar. 23, 2000 (GB) .............................................. 0006957

(51) Int. Cl.$^7$ ............................................ H01L 27/148
(52) U.S. Cl. ..................... 257/217; 257/335; 257/336; 257/339; 357/38
(58) Field of Search .............................. 357/38, 41, 43; 257/335, 336, 339

(56) References Cited

U.S. PATENT DOCUMENTS

| 4,754,310 A | 6/1988 | Coe ............................. 357/13 |
| 4,942,445 A | * 7/1990 | Baliga et al. .................. 357/38 |
| 5,264,719 A | * 11/1993 | Beasom ....................... 257/335 |
| 5,473,180 A | 12/1995 | Ludikhuize ................. 257/336 |

FOREIGN PATENT DOCUMENTS

WO    9935695 A1    7/1999

* cited by examiner

*Primary Examiner*—David Nelms
*Assistant Examiner*—Mai-Huong Tran
(74) *Attorney, Agent, or Firm*—Steven R. Biren

(57) ABSTRACT

A semiconductor body (11) has first and second opposed major surfaces (11a and 11b). First and second main regions (13 and 14) meet the second major surface (11b) and a voltage-sustaining zone is provided between the first and second regions (13 and 14). The voltage-sustaining zone has a semiconductor region (11) of one conductivity type forming a rectifying junction (J) with a region (15) of the device such that, when the rectifying junction is reverse-biased in one mode of operation, a depletion region extends in the semiconductor region of the voltage-sustaining zone. A number of conductive regions (22) are isolated from and extend through the semiconductor region (11) in a direction transverse to the first and second major surfaces (11a and 11b) so as to be spaced apart in a direction between first and second main regions. A voltage regulator (20; 20'; 20a and 20b) is provided for setting the voltage at each conductive regions (22) so as to control the voltage distribution, and thus the electrical field profile, in the voltage-sustaining zone when the rectifying junction is reverse-biased in said one mode of operation.

15 Claims, 2 Drawing Sheets

LATERAL SEMICONDUCTOR DEVICE FOR WITHSTANDING HIGH REVERSE BIASING VOLTAGES

FIELD OF THE INVENTION

This invention relates to a semiconductor device, in particular a lateral semiconductor device that is capable of withstanding high reverse biasing voltages.

BACKGROUND OF THE INVENTION

It is well known in the semiconductor art that the spread of the depletion region of a reverse-biased rectifying junction (and so the breakdown voltage of that junction) can be increased by reducing the dopant concentration and increasing the size of a semiconductor region associated with the rectifying junction. However, although this enables the reverse breakdown voltage to be increased, it also increases the resistivity and length of the current path through the device when the rectifying junction is forward biased. The series resistivity of the current path for majority charge carriers through the device increases in proportion to approximately the square of the desired reverse breakdown voltage, so limiting the current handling capability of the device for a given maximum thermal dissipation.

U.S. Pat. No. 4,754,310 (our reference PHB32740) addresses this problem by providing one of the regions forming the rectifying junction as a voltage-sustaining zone formed of first regions of one conductivity type interposed with second regions of the opposite conductivity type with the dopant concentrations and dimensions of the first and second regions being such that, when the rectifying junction is reverse biased in operation and the voltage-sustaining zone is depleted of free charge carriers, the space charge per unit area in the first and second regions balances at least to the extent that the electric field resulting from the space charge is less than a critical field strength at which avalanche breakdown will occur. This enables the required reverse breakdown voltage characteristics to be obtained using interposed semiconductor regions which individually have a higher dopant concentration, and thus lower resistivity, than would otherwise be required so that the series resistivity of the first and second regions and thus the on-resistance of the device can be lower than for a conventional device. U.S. Pat. No. 4,754,310 does, however, require good control over the dopant concentrations and thicknesses of the interposed layers in order to achieve the required space charge balancing.

SUMMARY OF THE INVENTION

It is an aim of the present invention to provide another way of improving the trade-off between breakdown voltage and on-resistance in a lateral high voltage semiconductor device that does not require precise charge balancing.

In one aspect, the present invention provides a semiconductor device as set out in claim 1.

According to one aspect of the present invention, there is provided a lateral semiconductor device wherein a voltage-sustaining zone is provided between first and second main regions of the semiconductor device, the semiconductor device further comprising means for adjusting the voltage profile within the voltage-sustaining zone between the first and second main regions So as to increase the reverse breakdown voltage that can be achieved by the device for a given dopant concentration and length of the voltage-sustaining zone between the first and second main regions, the voltage profile adjusting means comprising a plurality of electrically conductive regions disposed within and insulated from the voltage-sustaining zone so as to be spaced-apart at least in the direction between the first and second main regions and means for setting or regulating the voltage at each electrically conductive region so that, when a reverse biasing voltage is applied between the first and second main regions, each electrically conductive region acts to set or fix the voltage at its location in the voltage-sustaining zone.

In a device embodying the invention, the electrical potential in a direction between the first and second main regions can be controlled so as to increase linearly from the first main region to the second main region to deplete the voltage-sustaining zone, so enabling the length of the voltage-sustaining zone to be significantly reduced and the dopant concentration of the voltage-sustaining zone to be increased relative to a conventional device having the same structure but without the voltage profile adjusting means. Because the dopant concentration of the voltage-sustaining zone can be increased, the resistivity of the current path between the first and second main regions while the device is conducting is also reduced relative to a conventional device.

The voltage regulating means or regulator may comprise a voltage regulating region electrically coupled to at least one of the first and second main regions with the electrically conductive regions being coupled to spaced apart locations along the voltage regulating region. In a preferred arrangement, the voltage regulating region is electrically coupled between the first and second main regions.

The voltage regulating region may comprise a bleed layer, for example a layer of oxygen doped polycrystalline silicon. As another possibility, the voltage regulating region may comprise a semiconductor region such that, when the semiconductor region and the voltage-sustaining zone are depleted of free charge carriers in a mode of operation of the device, the space charge in the semiconductor region substantially balances with the space charge in the voltage-sustaining zone. As yet another possibility, the voltage regulating region may comprise a semiconductor structure consisting of first regions of one conductivity type interposed with second regions of the opposite conductivity type such that, when the first and second regions are depleted of free charge carriers in a mode of operation of the device, the space charge of the first and second regions substantially balances.

The electrically conductive regions may be formed of any suitable low resistance material such as a metal or highly doped semiconductor.

An embodiment of the present invention enables a lateral semiconductor device to be provided that enables the trade-off between reverse breakdown voltage and on-resistance to be improved in a manner different from that proposed in U.S. Pat. No. 4,754,310 and which avoids the need for precise charge balancing between opposite conductivity type regions in the voltage-sustaining zone.

It should be noted that WO 99/35695 proposes a silicon on insulator (SOI) high voltage insulated gate field effect device in which the voltage-sustaining zone or drain drift region of a lateral insulated gate field effect transistor is formed with a grid-like arrangement of columnar grooves filled with semiconductor material of the opposite conductivity type to the drain drift region. In this arrangement, the opposite conductivity type pillars in the columnar grooves are floating, that is they are not connected to either the source or drain electrode, and a linear voltage profile is achieved within the voltage-sustaining zone through impact-ionization related small leakage currents so that the arrangement is self-regulating. WO 99/35695 does not require precise space charge balancing because the opposite conductivity type regions within the drain drift region are floating. However, in the device of WO 99/35695 the electric field at one side of the pillars must be zero otherwise that pn junction between the pillar and the drain drift region would be forward-biased and a current would exist that could not be supported. This may limit potential gain in specific Rdson. Also, the presence of so many opposite conductivity type regions in the drain drift region. in the device described in WO 99/35695 may cause charge storage problems and parasitic bipolar transistor or thyristor action.

In contrast to WO 99/35695, the present invention does not require that the material in the openings or grooves be opposite conductivity type semiconductor material so that the above described problems resulting from the use of opposite conductivity type material need not occur. Indeed the present invention enables any low electrical resistance material to be used, for example a metal or even highly doped semiconductor of the same conductivity type as the drain drift region.

Other advantageous technical features in accordance with the present invention are set out in the appended dependent claims.

BRIEF DESCRIPTION OF THE DRAWINGS

Embodiments of the present invention will now be described, by way of example, with reference to the accompanying diagrammatic drawings, in which.

It should be noted that FIGS. 1 to 3, 5 and 6 are diagrammatic with relative dimensions and proportions of parts having: been shown exaggerated or reduced in size for the sake of clarity and convenience. The same reference signs are generally used to refer to corresponding or similar features in different embodiments.

DESCRIPTION OF THE PREFERRED EMBODIMENTS

Figure 1:
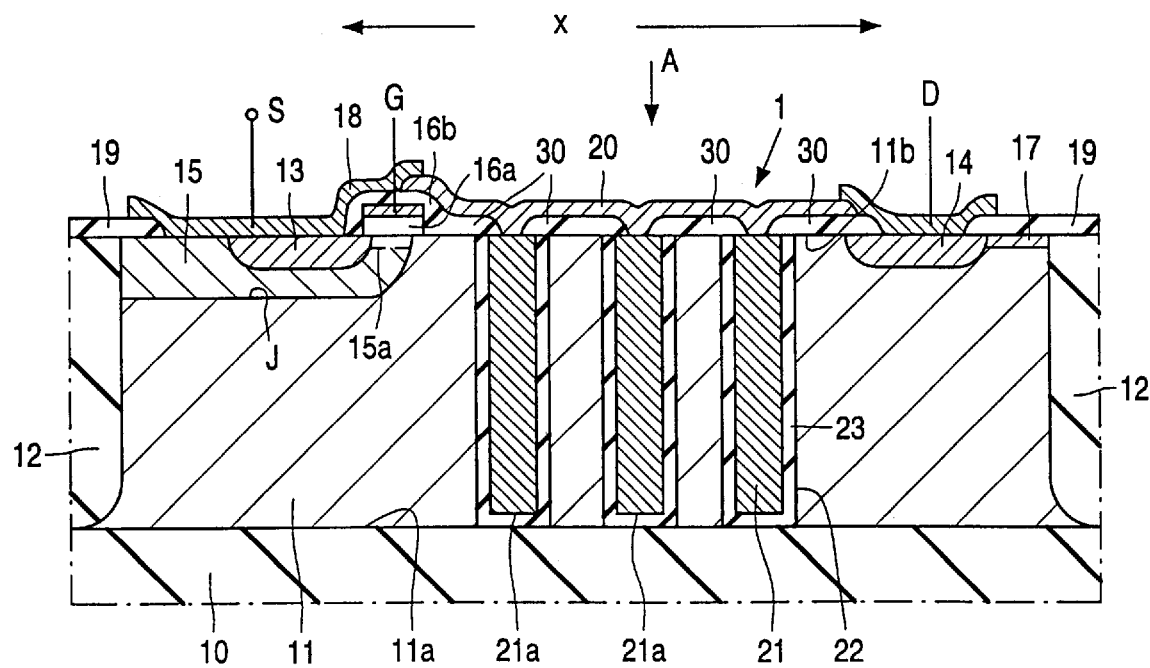
FIG. 1 shows a diagrammatic cross-sectional view through part of a first embodiment of a semiconductor device in accordance with the present invention and comprising an insulated gate field effect transistor.

FIG. 1 shows a semiconductor device 1 comprising a lateral insulated gate field effect transistor. The semiconductor device 1 has a substrate 10 carrying a silicon epitaxial layer 11 which is lowly doped with impurities of the one conductivity type (n-conductivity type in this example). The substrate 10 may comprise at least an upper insulating layer adjoining the epitaxial layer 11, that is the device may be a silicon on insulator device, or the substrate 10 may be lowly doped with impurities of the opposite conductivity type, p-conductivity type in this example. The epitaxial layer 11 has first and second major surfaces 11a and 11b with the first major surface 11a adjoining the substrate 10.

The semiconductor device may be formed as a discrete device or may be integrated in the same semiconductor body with other semiconductor devices. Especially in the latter case, the area of the epitaxial layer 11 within which the insulated gate field effect device is provided may be bounded by isolation regions 12. These isolation regions may be, for example, dielectric regions or highly doped regions of the opposite conductivity type (p-conductivity type in this example). Although not shown in FIG. 1, the epitaxial layer 11 may carry further semiconductor devices bounded by respective isolation regions 12.

The insulated gate field effect device has source and drain regions 13 and 14 each meeting the second major surface 11b and spaced apart along the second major surface. The source region 13 is contained within a body region 15 of the opposite conductivity type forming a pn junction J with the epitaxial layer 11. The source and body regions 13 and 15 define therebetween a conduction channel accommodation portion 15a in the body region 15. An insulated gate structure G comprising a gate dielectric layer 16a and a gate conductive layer 16b is provided on the second major surface 11b so as to extend over the channel accommodation portion 15a. As shown in FIG. 1, the area of the second major surface 11b between the drain region. 14 and the isolation region 12 may contain a region 17 meeting the second major surface 11b and of the same conductivity type as but more highly doped than the epitaxial layer 11 so as to form, as is known in the art, a channel-stopper region.

A dielectric layer is provided on the second major surface and patterned so as to define a dielectric region 18 over the insulated gate structure G and dielectric regions 19 at the boundaries of the lateral insulated gate field effect device. Metallisation is deposited in windows in the dielectric layer and patterned so as to define source and drain electrodes S and D. As is known in the art, the source electrode S shorts the source region 13 to the body region 15 at a location away from the channel accommodation portion 15a so as to inhibit parasitic bipolar action. Although not shown in FIG. 1, a window is opened in the dielectric region 18 over the insulated gate structure G away from the source and drain electrodes S and D and the metallisation patterned so as to define a gate electrode (not shown) electrically contacting the gate conductive region 16b.

The structure of FIG. 1 described so far is the same as that of a conventional lateral insulated gate field effect device wherein the epitaxial layer 1 forms a drain drift region providing a voltage-sustaining zone that enables the device to withstand high reverse biasing voltages when a voltage is applied between the source and drain electrodes S and D in use of the device but the device is non-conducting because no voltage is applied to the gate electrode.

However, in accordance with the present invention, the drain drift region or voltage-sustaining zone 11 is associated with voltage profile adjusting means for adjusting the voltage profile within the drain drift region between the source and drain regions 13 and 14. The voltage profile adjusting means comprises a plurality of electrically conductive, that is low electrical resistance, regions 21 spaced-apart from one another at least in the direction x between the source and drain regions 13 and 14. The low resistance regions 21 extend through at least a substantial proportion of the thickness of the epitaxial layer 11. As shown, the low resistance regions 21 extend completely through the epitaxial layer 11. Each of the low resistance regions 21 is isolated from the epitaxial layer 11 by an insulating layer 23.

In the example shown in FIG. 1, the low resistance regions 21 are formed in openings 22 extending completely through the epitaxial layer 11 and the insulating layers 23 are provided on the walls of the openings 22. Usually, the insulating layers 23 will be formed of silicon dioxide, although other insulating materials such as silicon nitride may be used. The low resistance region s 21 are formed of a conductive, that is relatively low resistance material, such as a metal that may be deposited into the openings 22 using conventional chemical vapour deposition techniques. In principle the conductive material should have a conductivity that enables the inside of the entirety of the openings 22 to be set at the same voltage. A typical metal that maybe used is aluminum. As another possibility, the low resistance regions 21 may be formed by highly doped semiconductor material that may be doped with either n or p conductivity type impurities because it is isolated by the insulating layer 23 from the epitaxial layer 11.

The low resistance regions 21 are coupled to voltage setting means for enabling the voltage at each low resistance region to be set. The voltage setting means comprises a voltage regulating region 20 extending along the second major surface 11b between the source and drain electrodes S and D with one end electrically coupled to the source electrode S and the other end electrically coupled to the drain electrode D.

In this embodiment, the voltage regulating region 20 comprises a current leakage path or bleeder which effectively forms a potential divider so that When a voltage is applied between the source and drain electrodes S and D, each low resistance region is set or fixed at a respective electrical potential determined by the voltage between the source and drain electrodes S and D, the resistance of the bleeder and the distance along the bleeder from the source electrode S to the low resistance region 21. The bleeder 20 is electrically isolated from the second major surface 11b of the epitaxial layer 11 by dielectric regions 30. The bleeder 20 should have a resistivity high enough to avoid excessive leakage currents yet not so high that the device transient characteristics are adversely affected. For example, the minimum resistivity may be $2 \times 10^8$ Ohm-cm. Materials such as oxygen-doped polycrystalline silicon (SIPOS) provide an appropriate resistivity.

Figure 3:
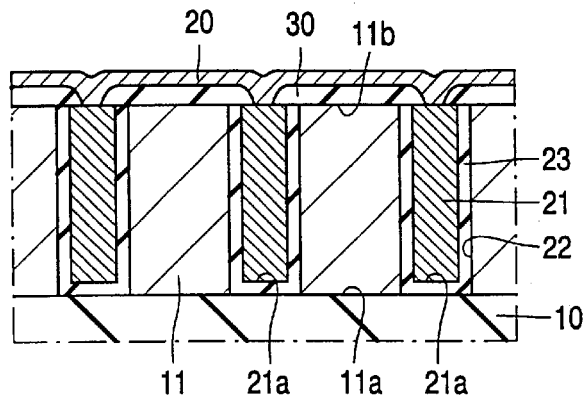
FIG. 3 shows a cross-sectional view through the voltage-sustaining zone of a further semiconductor device embodying the present invention.

FIG. 1 shows the openings 22 as extending just to the substrate 10. However, as shown in FIG. 3, the openings 22 may extend slightly into the substrate 10 so that the bottom ends 21a of the low resistance regions 21 are flush with the first major surface 11a so as to ensure that the low resistance regions 21, and thus the voltages applied thereto, extend completely through the epitaxial layer 11.

Figure 2:
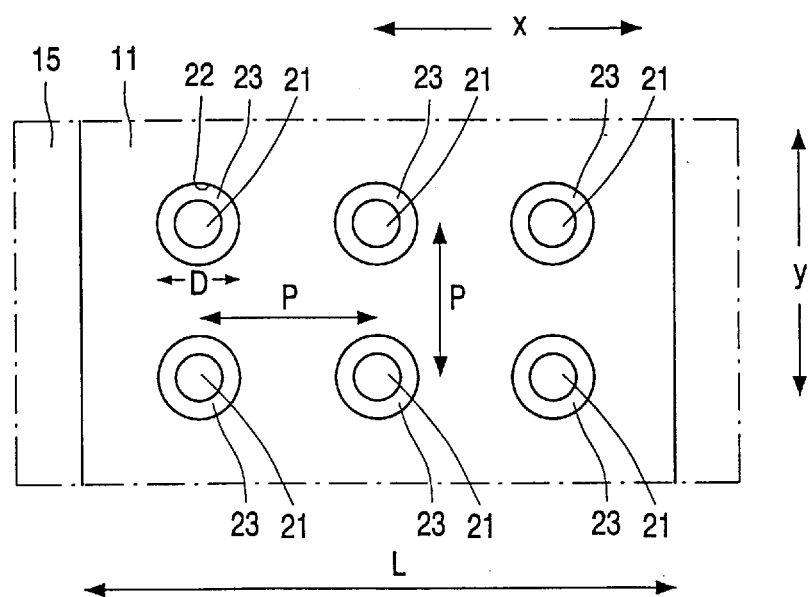
FIG. 2 shows a top plan view, that is looking in the direction of arrow A in FIG. 1, of a voltage-sustaining zone of the lateral insulated gate field effect transistor shown in FIG. 1.

FIG. 2 shows a top plan view looking in a direction of the arrow A of part of the device 1 shown in FIG. 1 with the structures on the surface of the second major surface 11b (including the bleeder 20) omitted and with the various regions shown unhatched in the interests of clarity. As can be seen from FIG. 2, the drain drift region 11 of the device 1 has low resistance regions 21 spaced apart from one another in the direction y (that is parallel to the channel width of the device) as well as in the direction x (that is parallel to the channel length). Each low resistance region 21 is, although not shown in FIG. 2, electrically coupled to the bleeder 20 and is also isolated from the surrounding epitaxial layer 11 by a corresponding insulating layer 23.

Although six low resistance regions 21 are shown in FIG. 2, it will be appreciated that the number, diameter D and pitch P of the low resistance regions 21 will depend upon the desired device characteristics. In the arrangement shown in FIG. 2, the low resistance regions 21 are evenly spaced in both the x and y directions and have the same pitch P in both the x and y directions. The diameter D of the low resistance regions is constrained by manufacturing limitations which place a lower practical limit on the diameter of opening 22 that can be filled and by the desire to have several openings in the drift region to spread the electric field effectively. Typically a device capable of withstanding a 1000 volts will have a drain drift region length L between the body and drain regions 15 and 14 of 50 micrometers. Typically the diameter D will be in the range of 0.5 to 5 micrometers for such a 1000 volt device. The pitch of the low resistance regions 21 may vary, for example, so that the low resistance regions 21 are closer together in regions of high electric field, for example adjacent to the junctions between the drain drift region 11 and the body and drain regions 15 and 14.

Figure 4:
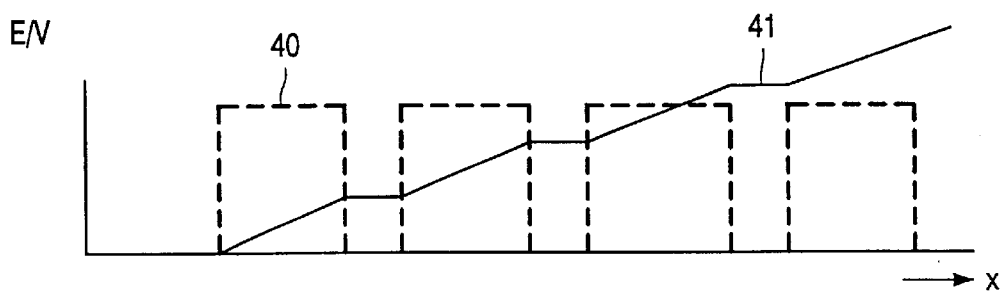
FIG. 4 is a graph showing the electric field and voltage distribution in a direction x across the voltage-sustaining zone from the first to the second main region of the semiconductor device shown in FIG. 1 or as modified in accordance with FIG. 3.

FIG. 4 shows a graph to illustrate the electrical field profile (shown by the dashed line 40). and the voltage profile (shown by the solid line 41) across the drain drift region 11 when voltages are applied to the source and drain electrodes S and D so that the junction J between the body region 15 and the drain drift region 11 is reverse-biased but the device is non-conducting, that is no voltage is applied to the gate electrode and so no conduction channel is formed in the channel accommodation portion 15a. In FIG. 4, x increases with distance away from the source region 13. As can be seen from FIG. 4, in this off-state or off-condition, the electrical potential at the low resistance regions 21 increases linearly in the direction of increasing x, that is towards the drain region 14, and the surrounding drain drift material is depleted. As in the devices described in U.S. Pat. No. 4,754,310 (PHB32740), the electric field profile does not have the triangular shape associated with conventional devices but has a rectangular or square shape. The provision of the low resistance regions 21 and the voltage setting means 20, in this embodiment the bleeder, means that not oily can the drain drift region length L, and thus the length (that is the distance in the direction x) of the device, be reduced to about one half of that required in a conventional structure to achieve a particular breakdown voltage but the dopant concentration in the drain drift region 11 can be increased as the breakdown voltage is less dependent on dopant concentration in the drain drift region because the low resistance regions 21 serve to control the voltage and electric field distribution to ensure full depletion throughout the drain drift region 11 before the required breakdown voltage is achieved.

The on-resistance of the device 1 should be smaller than that of a conventional device having the structure shown in FIG. 1 but without the resistive path 20 and the associated low resistance regions 21. Because the voltage difference between the source and drain electrodes S and D in the on-state of the device 1, that is when a voltage is applied to the gate G to induce a conduction channel in the channel accommodation portion 15a, is very much smaller than in the off or non-conducting state, the leakage current along the bleeder 20 in the on-state is acceptable, generally negligible, and has no real impact on the device operation in the on-state. There is, of course, a trade off between the area taken up by the openings 22 (which could otherwise be used as drift area) and the size of the areas of drain drift region between the openings 22 which should be depleted in the off-state to generate the required flat field profile as this size is inversely proportional to the maximum doping concentration in these areas of drain drift region. Decreasing the diameters of openings 22 would enable the pitch P between openings 22 to be reduced and the dopant concentration of the drain drift region 11 to be increased, so enabling a lower drain drift resistance. The optimum ratio between the area taken up by the openings 22 and the remaining drift region 11 is determined by the minimum lithographic dimensions possible for forming and then filling the openings 22.

The device 1 may be manufactured using conventional semiconductor processing technology with the only modifications being that, before formation of the body, source and the drain regions, the second major surface 11b is masked to define windows over the areas where the low resistance regions 21 are required and then the epitaxial layer 11 is etched using a conventional anisotropic etching process to define the openings 22 extending at least through a substantial proportion of the epitaxial layer, as shown throughout its entirety. The insulating layer 23 is then formed on the walls of the openings 22 as either a thermally grown or deposited oxide and then the low resistance regions 21 are formed by known chemical vapour deposition techniques. After removal of the mask from the second major surface 11b, the insulated gate structure 16a, 16b is formed by deposition and patterning of gate insulative and conductive layers. A body region mask is then defined on the second major surface lib and the impurities for forming the body region 15 are introduced. After removal of the body region mask, a source and drain mask is defined on the second major surface 11b and the impurities forming the source and drain regions 13 and 14 are introduced using that mask so that the conduction channel accommodation portion 15a is defined by relative diffusion of the impurities forming the body and source regions 15 and 13 beneath the insulated gate structure 16a, 16b.

After removal of the source and drain mask, insulating material, for example silicon oxide, is deposited and patterned using conventional photolithographic techniques to define the insulative regions 18, 19 and 30. Oxygen doped polycrystalline silicon (SIPOS) is then deposited and patterned to form the bleeder 20 and then, after formation of a window in the insulating region 18 away from the bleeder 20, metallisation is deposited and patterned to form the source and drain electrodes S and D and the gate electrode (not shown in FIG. 1).

As another possibility, the openings 22 may be formed and filled after formation of the source, drain and body regions.

Figure 5:
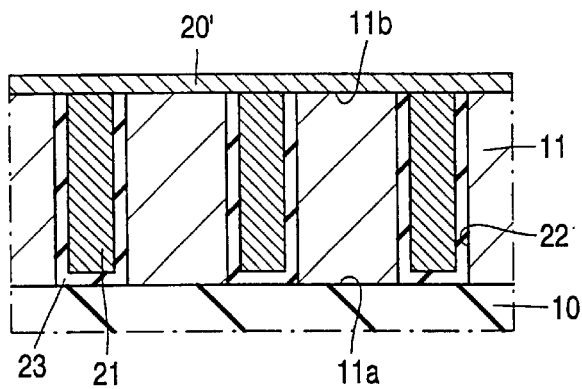
FIG. 5 shows a cross-sectional view similar to FIG. 3 through the voltage-sustaining zone of another embodiment of a semiconductor device embodying the invention.

FIG. 5 shows a view similar to FIGS. 3 and 4 to illustrate a further modification. In this case, the voltage regulating region is provided by a semiconductor layer 20' connected between the source and drain electrodes S and D and doped with impurities of the opposite conductivity type to the drain drift region 11, that is p-conductivity type impurities in this case, with the dopant concentration and thickness of the p-conductivity type semiconductor layer 20' being selected such that the semiconductor layer 20' is fully depleted of free charge carriers when the reverse biasing voltage is applied between the source and drain electrodes S and D as described above. As is known in the art, this would require the product of the dopant concentration and thickness of the semiconductor layer 20' to be approximately $2 \times 10^{12}$ cm$^{-2}$.

In this case the semiconductor layer 20' and the underlying drain drift region 11 are such that, when depleted of free charge carriers, the space charge per unit area in the semiconductor layer 20' and the drain drift region 11 balance at least to the extent that the electric field resulting from the space charge is less than a critical field strength at which avalanche breakdown will occur in the manner taught in U.S. Pat. No. 4,754,310, so enabling a lateral flat electric field profile at the top surface. The low resistance regions 22 are electrically coupled to semiconductor layer 20' so that the voltage at each low resistance region is determined by the voltage across the semiconductor layer 20' and the distance along the semiconductor layer 20' to the low resistance region 22 in a manner similar to that described above with reference to FIGS. 1 to 4 but with the advantage that there is no leakage current. In the arrangement shown in FIG. 5.

Figure 6:
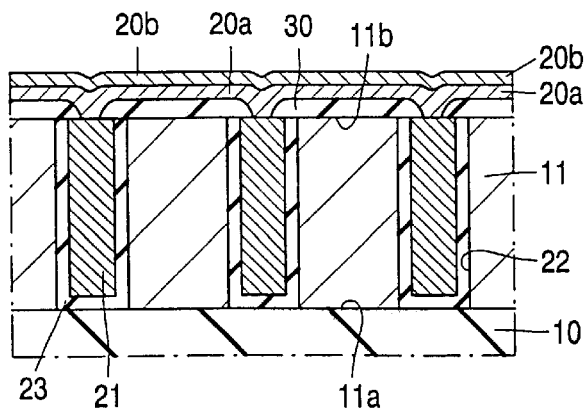
FIG. 6 shows a cross-sectional view similar to FIG. 3 through the voltage-sustaining zone of another embodiment of a semiconductor device embodying the invention.

In the arrangement shown in FIG. 5, space charge balancing is provided between the voltage regulating region and the drain drift region 11. FIG. 6 shows another arrangement in which the voltage regulating region consists of an n conductivity type first semiconductor region or layer 20a and a p conductivity type second region or layer 20b each extending between and electrically coupled to the source and drain electrodes S and D. In this case the first and second semiconductor layers 20a and 20b are such that, when depleted of free charge carriers, the space charge per unit area in the first and second semiconductor layers 20a and 20b balance at least to the extent that the electric field resulting from the space charge is less than a critical field strength at which avalanche breakdown will occur in the manner taught in U.S. Pat. No. 4,754,310, so enabling a lateral flat electric field profile at the top surface. The low resistance regions 22 are electrically coupled to the voltage regulating region so that the voltage at each low resistance region 22 is determined by the voltage across the voltage regulating region and the distance along the voltage regulating region to the low resistance region 22 in a manner similar to that described above with reference to FIGS. 1 to 4 but like the FIG. 5 arrangement with the advantage that there is no leakage current. As shown in FIG. 6, the voltage regulating region is isolated from the drain drift region 11 by dielectric regions 30 in a manner similar to that shown in FIGS. 1 and 3. As another possibility, the voltage regulating region may contact the top surface 11b. FIG. 6 has the advantage over FIG. 5 that it is not necessary to balance the dopant concentration and thickness of the drain drift region with that of the voltage regulating region, rather the thicknesses and dopant concentrations of the n and p conductivity type layers 20a and 20b provide the space charge balance. These arrangements have the advantage over the device described with reference to FIGS. 1 to 4 that there is no leakage current through the voltage regulating layer but the disadvantage that it is necessary to ensure a space charge balance between the n and p conductivity layers to within a few percent, although only the dopant concentration and thicknesses of two layers need be controlled.

Devices having the voltage-sustaining zone shown in FIGS. 5 and 6 may be manufactured in a manner similar to that described above with the oxygen doped polycrystalline silicon deposition step being replaced by epitaxial deposition of doped silicon or doping of a surface layer of the epitaxial layer 11 in known manner.

In the above described examples, the openings 22 are circular in cross-section, that is when viewed in plan. This has the advantage that the openings 22 have no sharp corners which would otherwise be sites of increased electrical field.

The openings 22 may, however, have other cross-sectional shapes, for example the cross-sectional shape may be in the form of a hexagon or square with rounded corners.

The present invention may be applied to lateral insulated gate field effect device structures other than that shown in FIG. 1, for example the type of insulated gate field effect device structure shown in U.S. Pat. No. 5,473,180 (our reference PHN14508) with the drain drift region of U.S. Pat. No. 5,473,180 being replaced by the drain drift region described above.

The present invention may also be applied to lateral insulated gate bipolar transistors, that is devices where the drain region 14 is of the opposite conductivity type (p-conductivity type in the above examples). The present invention may also be applied to normally on devices where the channel accommodation portion 15a is doped so as to be of the one conductivity type in the examples described above and a gate voltage is required to pinch off the channel and so switch off the device.

In the above described embodiments, the source and drain regions are both semiconductor regions. However, the source region may be provided as a Schottky contact region.

In the above-described embodiments, the voltage regulator is provided on the top or second main surface 11b of the epitaxial layer 11. The voltage regulator may alternatively, or additionally, be provided on the bottom or first main surface of the epitaxial layer 11. Other forms of voltage regulator for setting the voltages at the conductive regions 22 may be provided than the voltage regulating regions 20, 20' and 20a and 20b and the voltages provided by the voltage regulator need not necessarily be derived from the source to drain voltage, rather a separate voltage source tailored to enable the required voltage distribution or profile to be achieved may be used.

The present invention may also be applied to other forms of lateral devices such as lateral pn-n diodes, which, when viewed in plan, will have a structure similar to that shown in FIG. 2 with the source region 13 and insulated gate structure G shown in FIG. 1 being omitted.

The present invention may also be applied to semiconductor devices comprising semiconductor materials other than silicon such as germanium, for example. The conductivity types given above may be reversed.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

I claim:

1. A semiconductor device comprising a semiconductor body having first and second opposed major surfaces, first and second main regions meeting the second major surface and a voltage-sustaining zone provided between the first and second regions, the voltage-sustaining zone comprising a semiconductor region of one conductivity type forming a rectifying junction with a region of the device such that, when the rectifying junction is reverse-biased in one mode of operation, a depletion region extends in the semiconductor region of the voltage-sustaining zone, the device further comprising a plurality of conductive regions isolated from and extending substantially entirely through the semiconductor region in a direction transverse to the first and second major surfaces so as to be spaced apart in a direction between first and second main regions and a voltage regulator for setting the voltage at each of said conductive regions so as to control the voltage distribution, and thus the electrical field profile, in the voltage-sustaining zone when the rectifying junction is reverse-biased in aid one mode of operation.

2. A device according to claim 1, wherein each conductive region extends completely through the semiconductor region of the voltage-sustaining zone in a direction transverse to said direction in which the plurality of conductive regions are spaced apart.

3. A device according to claim 1, wherein the conductive regions extend within the semiconductor region so as to be spaced apart in two mutually perpendicular directions parallel to the first and second major surfaces.

4. A device according to claim 1, wherein the voltage regulator comprises a voltage distribution region coupled to at least one of the first and second main regions, with the conductive regions being coupled to the voltage distribution region at positions spaced apart in said direction between the first and second main regions.

5. A device according to claim 4, wherein the voltage distribution region is coupled between the first and second main regions.

6. A device according to claim 4, wherein the voltage distribution region extends substantially parallel to one of the first and second major surfaces from the first main region towards the second main region and along one of said first and second major surfaces.

7. A device according to claim 4, wherein the voltage distribution region comprises a current leakage path with the conductive regions being coupled to the current leakage path at position spaced apart in said direction between the first and second main regions.

8. A device according to claim 7, wherein the current leakage path comprises oxygen doped polycrystalline silicon.

9. A device according to claim 4, wherein the voltage distribution region comprises a semiconductor region of the opposite conductivity type to the semiconductor device of the voltage-sustaining zone and wherein dopant concentration and dimensions are such that the space charge in said semiconductor regions of the opposite conductivity type and the voltage-sustaining zone substantially balance when depleted of free charge carriers.

10. A device according to claim 4, wherein the voltage distribution region comprises first and second semiconductor regions of opposite conductivity types and wherein dopant concentration and dimensions of the first and second regions are such that the space charge in said first and second regions substantially balance when depleted of free charge carriers.

11. A device according to claim 1, wherein at least some of the conductive regions comprise a material selected from the group consisting of an electrically conductive material, such as a metal, and a doped semiconductor material.

12. A device according to claim 1, wherein the conductive regions are provided in openings formed in the semiconductor region of the voltage-sustaining zone.

13. A device according to claim 1, wherein the first and second main regions form source and drain regions, the voltage sustaining region forms a drain drift region and the rectifying junction is formed between the voltage sustaining zone and a body region defining with the source region a conduction channel accommodation portion, and a control gate is provided for enabling control of the formation of a conduction channel within the conduction channel accommodation portion.

14. A device according to claim 1, wherein at least one of the first and second main regions is a semiconductor region.

15. A device according to claim 1, wherein the semiconductor body has a substrate comprising of a material selected from the group consisting of a semiconductor and an insulator.

* * * * *